(12) United States Patent
Wang et al.

(10) Patent No.: US 11,599,751 B2
(45) Date of Patent: Mar. 7, 2023

(54) METHODS AND APPARATUS TO SIMULATE SENSOR DATA

(71) Applicant: Intel Corporation, Santa Clara, CA (US)

(72) Inventors: Zhigang Wang, Beijing (CN); Xuesong Shi, Beijing (CN)

(73) Assignee: Intel Corporation, Santa Clara, CA (US)

( * ) Notice: Subject to any disclaimer, the term of this patent is extended or adjusted under 35 U.S.C. 154(b) by 373 days.

(21) Appl. No.: 16/649,049

(22) PCT Filed: Dec. 28, 2017

(86) PCT No.: PCT/CN2017/119463
§ 371 (c)(1),
(2) Date: Mar. 19, 2020

(87) PCT Pub. No.: WO2019/127233
PCT Pub. Date: Jul. 4, 2019

(65) Prior Publication Data
US 2020/0218941 A1    Jul. 9, 2020

(51) Int. Cl.
*G06K 9/62* (2022.01)
*G06F 30/20* (2020.01)
(Continued)

(52) U.S. Cl.
CPC ........... *G06K 9/6257* (2013.01); *G06F 30/20* (2020.01); *G06K 9/6255* (2013.01); *G06N 3/08* (2013.01); *G06V 10/46* (2022.01); *G06V 10/473* (2022.01)

(58) Field of Classification Search
CPC .... G06K 9/6257; G06K 9/6255; G06F 30/20; G06N 3/08; G06N 3/0454; G06V 10/46; G06V 10/473
See application file for complete search history.

(56) References Cited

U.S. PATENT DOCUMENTS 8,965,112 B1    2/2015    Ibarz et al.
9,454,714 B1    9/2016    Ibarz et al.
(Continued)

FOREIGN PATENT DOCUMENTS

CN    106845515    6/2017
CN    106875361    6/2017
(Continued)

OTHER PUBLICATIONS

International Searching Authority, "Search Report," issued in connection with International Patent Application No. PCT/CN2017/119453, dated Sep. 14, 2018, 4 pages.
(Continued)

*Primary Examiner* — Wesley J Tucker
(74) *Attorney, Agent, or Firm* — Hanley, Flight & Zimmerman, LLC

(57) ABSTRACT

Methods, apparatus, systems, and articles of manufacture to simulate sensor data are disclosed. An example apparatus includes a noise characteristic identifier to extract a noise characteristic associated with a feature present in first sensor data obtained by a physical sensor. A feature identifier is to identify a feature present in second sensor data. The second sensor data is generated by an environment simulator simulating a virtual representation of the real sensor. A noise simulator is to synthesize noise-adjusted simulated sensor data based on the feature identified in the second sensor data and the noise characteristic associated with the feature present in the first sensor data.

21 Claims, 5 Drawing Sheets

(51) Int. Cl.
  *G06N 3/08* (2006.01)
  *G06V 10/46* (2022.01)

(56) References Cited

U.S. PATENT DOCUMENTS

| | | | |
|---|---|---|---|
| 2016/0180541 A1 | 6/2016 | Romanenko | |
| 2017/0132334 A1* | 5/2017 | Levinson | G01S 17/931 |
| 2017/0270653 A1 | 9/2017 | Garnvi et al. | |
| 2017/0365038 A1 | 12/2017 | Denton et al. | |
| 2018/0349526 A1* | 12/2018 | Atsmon | G06T 19/003 |
| 2019/0050682 A1* | 2/2019 | Sutic | G06V 10/82 |
| 2019/0294742 A1* | 9/2019 | Zhao | G01M 11/0221 |
| 2019/0340469 A1* | 11/2019 | Su | G06N 3/08 |
| 2020/0051327 A1* | 2/2020 | Dolan | G06F 30/20 |
| 2020/0057831 A1* | 2/2020 | Wu | G06T 7/521 |
| 2020/0302241 A1* | 9/2020 | White | G06N 20/20 |
| 2021/0019457 A1* | 1/2021 | Brown | G01S 15/93 |
| 2021/0073640 A1* | 3/2021 | Palla | G06N 3/04 |
| 2021/0350046 A1* | 11/2021 | Bosson | G06F 30/20 |

FOREIGN PATENT DOCUMENTS

| | | |
|---|---|---|
| CN | 107016406 | 8/2017 |
| CN | 107292813 | 10/2017 |
| WO | 2019127231 | 7/2019 |
| WO | 2019127233 | 7/2019 |

OTHER PUBLICATIONS

International Searching Authority, "Written Opinion," issued in connection with International Patent Application No. PCT/CN2017/119463, dated Sep. 19, 2018, 4 pages.
Arjovsky et al., "Wasserstein GAN," [https://arxiv.org/abs/1701.07875], Courant Institue of Mathematical Sciences, Facebook Al Research, Mar. 9, 2017, 32 pages.
Goodfellow et al., "Generative Adversarial Nets," [https://arxiv.org/abs/1406.2661], Département d'informatique et de recherche opérationnelle Universitéde Montréal, Montréal, QC, Jun. 10, 2014, 9 pages.
Tu, "Learning Generative Models via Discriminative Approaches," [https://ieeexplore.ieee.org/document/4270060], 2007 IEEE Conference on Computer Vision and Pattern Recognition, Minneapolis, MN, 2007, 8 pages.
Bullet Physics Library, "Bullet 2.87 with pybullet robotics Reinforcement Learning environments," [http://bulletphysics.org/wordpress/], Nov. 15, 2017, 8 pages.
Shrivastava et al., "Learning from Simulated and Unsupervised Images through Adversarial Training," [https://arxiv.org/pdf/1612.07828.pdf], Apple Inc, Jul. 19, 2017, 16 pages.
International Searching Authority, "Search Report," issued in connection with International Patent Application No. PCT/CN2017/119463, dated Sep. 11, 2018, 5 pages.
International Searching Authority, "Written Opinion," issued in connection with International Patent Application No. PCT/CN2017/119453, dated Sep. 19, 2018, 5 pages.

* cited by examiner

METHODS AND APPARATUS TO SIMULATE SENSOR DATA

This patent arises from a U.S. National Stage of International Patent Application Serial No. PCT/CN2017/119463. International Patent Application Serial No. PCT/CN2017/119463 is hereby incorporated by reference in its entirety. Priority to International Patent Application Serial No. PCT/CN2017/119463 is hereby claimed.

FIELD OF THE DISCLOSURE

This disclosure relates generally to robotic simulation, and, more particularly, to methods and apparatus to simulate sensor data.

BACKGROUND

In recent years, machine learning (e.g., using neural networks) has become increasingly used to train, among other things, autonomous devices (e.g., robots, self-driving cars, drones, etc.) to understand the environment(s) in which they operate and to take appropriate action.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Increasingly, devices are being implemented using machine learning (e.g., using neural networks). The training of such devices often requires substantial amounts of training data. However, collecting training data in the real world can be complex and expensive, especially in robot-related contexts. Synthesis (e.g., simulation, modeling, etc.) can be used to generate training data. For example, a virtual environment can be used (e.g., simulated, modeled, generated, created, maintained, etc.) to train a virtualized (e.g., simulated, modeled, etc.) version a real device (e.g., a robot). The use of virtual training has facilitated research and development on autonomous devices in virtual environments.

Vision sensor data is an important data type used by robotic systems for making decisions (e.g., navigating an environment, picking up an item, etc.). For example, robot navigation typically utilizes Light Detection and Ranging (LIDAR) and/or a depth camera to build a map for utilization by the robotic system. Robot manipulation typically utilizes a depth camera to enable collision avoidance.

Unfortunately, virtual training has not proven as useful in training actual real-world autonomous devices to operate in the real world. One challenge is the gap between the characteristics of virtual (e.g., synthesized) training data, and the characteristics of real-world training data. For example, real-world training data often contains some degree of inaccuracies and/or non-random noises, which are hard, if even possible, to model (e.g., simulate, synthesize, etc.).

Real (e.g., physical) sensors cannot observe the world perfectly. Typically, there is some amount of noise and/or error in the output of such a sensor. To present a more realistic simulated environment, existing robot simulation systems generate ground-truth data and add noise in an attempt to replicate the noisy sensors of the real world. As used herein, ground-truth data is defined to be simulated input data that does not include noise.

Figure 1:
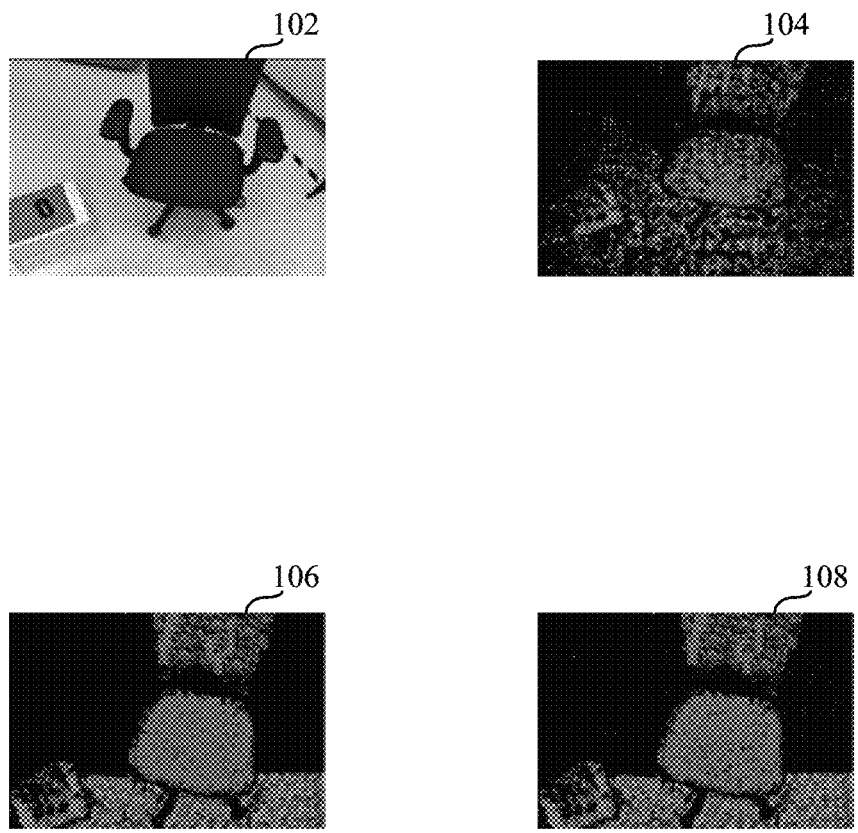
FIG. 1 is an illustration of example images that may be used when simulating sensor data.

FIG. 1 is an illustration of example images that may be used when simulating sensor data. The illustrated example of FIG. 1 includes a first image 102 representing a real testing environment. A second image 104 represents sensor data captured by a real-world sensor. In the illustrated example of FIG. 1, the second image 104 is captured by an Intel RealSense camera. A third image 106 represents a ground-truth image generated by an environment simulator. That is, the third image 106 represents an expected output of the sensor without any noise.

A fourth image 108 represents the ground-truth image 106 with added noise. In known approaches, noise is added using ray tracing and/or Gaussian noise. A ray tracing algorithm generates the sensor output by tracing a path of light through pixels in an image plane and simulating the effects of its encounters with virtual objects. A Gaussian noise approach enables a developer to set the mean and the standard deviation of the Gaussian distribution from which noise values will be sampled.

In the illustrated example of FIG. 1, there is a noticeable difference between the second image 104 (representing real sensor data) and the fourth image (representing ground-truth data with added noise). In some examples, it is very difficult for a developer to precisely adjust the noise parameters to add noise that more closely resembles the real sensor data. Moreover, previous solutions add noise to the ground-truth data evenly, which is inconsistent with real sensor data. The noise of the sensor has a certain relationship with the environment. For example, the noise of an Intel RealSense camera tends to be greater at and/or near the edge(s) of round objects. Moreover, the relationship between noise and the environment in different sensors is also different.

Example approaches disclosed herein utilize neural networks to perform synthesis of vision sensor data. Such approaches enable robotic simulation systems to generate noise-adjusted simulated sensor data that more closely resembles real sensor data. Utilizing noise-adjusted simulated sensor data enables simulated robotic controllers (e.g., virtual controllers) to train robotic control systems more efficiently, as such training does not rely on real-world interactions (e.g., a robot being moved in a physical space).

Example approaches disclosed herein utilize a convolutional neural network to detect noise characteristics from real sensor data captured using the sensors to be simulated. A convolutional neural network is also used to extract image features from ground truth data. Using the extracted features and detected noise, noise-adjusted simulated sensor data is synthesized.

Figure 2:
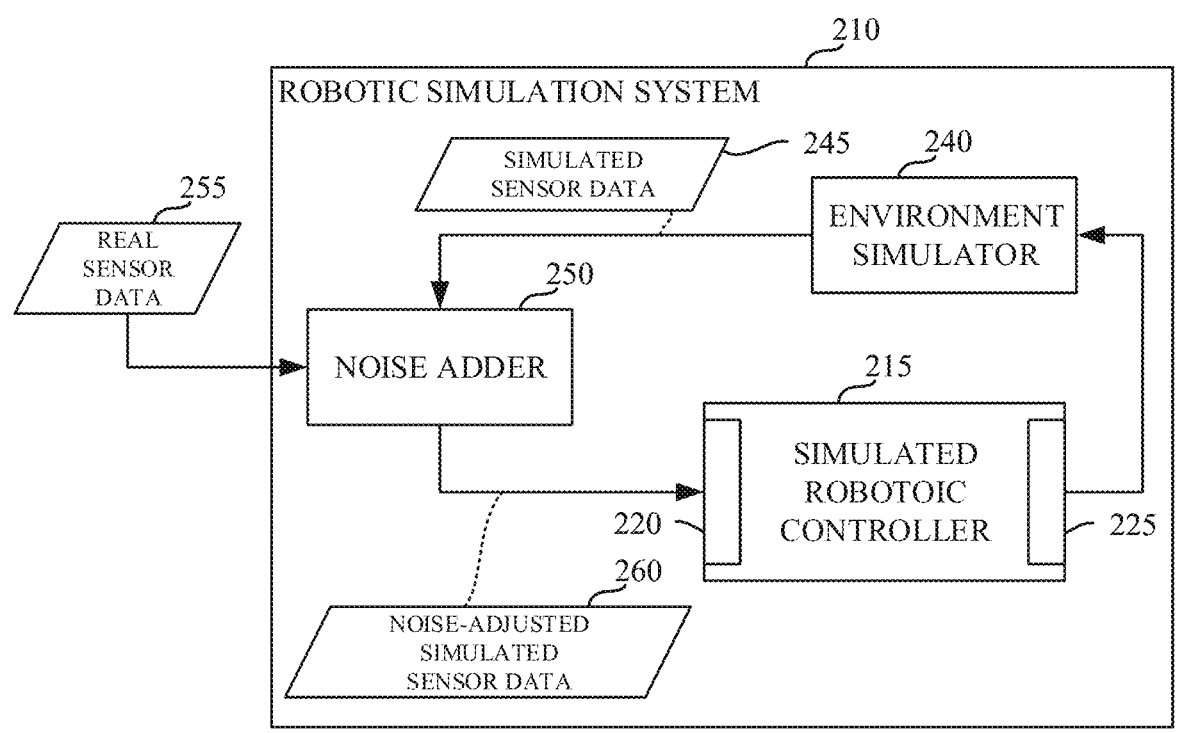
FIG. 2 is a block diagram of an example robotic simulation system constructed in accordance with the teachings of this disclosure.

FIG. 2 is a block diagram of an example robotic simulation system 210 constructed in accordance with the teachings of this disclosure. The example robotic simulation system 210 includes a simulated robotic controller 215, an example environment simulator 240, and an example noise adder 250. The example simulated robotic controller 215 includes simulated inputs 220 and simulated outputs 225. In the illustrated example of FIG. 2, the example simulated robotic controller 215 simulates operations of a robot (e.g., a virtualized robot) and provides simulated outputs to the example environment simulator 240. Using the simulated outputs, the example environment simulator 240 generates ground truth data representing inputs expected to be received by the simulated robot. However, as noted above, such ground truth data is too perfect and does not represent real-world conditions for operation of the robot. In the illustrated example of FIG. 2 the simulated sensor data 245 e.g. the ground truth data is passed to the noise adder 250 which, based on real sensor data 255, adds noise to the simulated sensor data 245 to create noise adjusted simulated sensor data 260. The example noise adder 250 provides the noise adjusted simulated sensor data 260 to the simulated input 220 of the example simulated robotic controller 215.

The example simulated robotic controller 215 of the illustrated example of FIG. 2 implements a simulated robot (e.g., a virtual robot, a virtual self-driving car, a virtual drone, etc.). That is, the simulated robotic controller 215 implements a virtualized version (e.g., a simulated version, a modeled version, etc.) of a corresponding real-world device (e.g., an actual robot, an actual self-driving car, an actual drone, etc.). In operation, the robot simulated by the example simulated robotic controller 215 is intended to operate substantially as if it were the real device to which it corresponds. The example simulated robotic controller includes the simulated inputs 220 and the simulated outputs 225. The example simulated inputs 220 represent simulated sensors. The example simulated outputs 225 represent simulated actuator outputs of the robot such as, for example, simulated actuators, simulated motors, etc.

The example environment simulator 240 of the illustrated example of FIG. 2 monitors the outputs of the simulated robotic controller 215 and generates simulated sensor data 245. For example, if the simulated outputs indicate that the virtual robot is expected to be at a particular location within a virtual environment, the environment simulator may produce an image that is expected to be captured by a virtual sensor when the virtual robot is at that location. While in examples disclosed herein, the simulated sensor data is described as an image, any other type of sensor data may additionally or alternatively be used. In examples disclosed herein, the simulated sensor data 245 is referred to as a ground-truth $\vec{t}$, which represents the target environment generated by a simulator (e.g., without any noise).

The example noise adder 250 of the illustrated example of FIG. 2 processes real sensor data captured by a real version of the simulated sensor data as well as the example simulated sensor data 245 received from the example environment simulator 240 to create noise-adjusted simulated sensor data 260 for use by the example simulated robotic controller 215. In examples disclosed herein, the real sensor data is representative of one or more real-world sensor output(s) created by the sensor simulated by the example environment simulator 240. In examples disclosed herein, the example real sensor data 255 does not need to have any relationship with the simulated environment.

The example noise adder 250 processes the real sensor data (e.g., the real sensor data 255) to extract noise characteristics of features present in the real sensor data 255. The example noise adder 250 processes the simulated sensor data 245 to extract features present in the simulated sensor data 245. The example noise adder 250 then synthesizes noise-adjusted simulated sensor data 260 that represents the simulated sensor data 245, with added noise based on the features identified in the simulated sensor data 245 and the characteristics of those features identified in the real sensor data 255. An example implementation of the noise adder 250 is described in further detail in connection with the illustrated example of FIG. 3, below.

Figure 3:
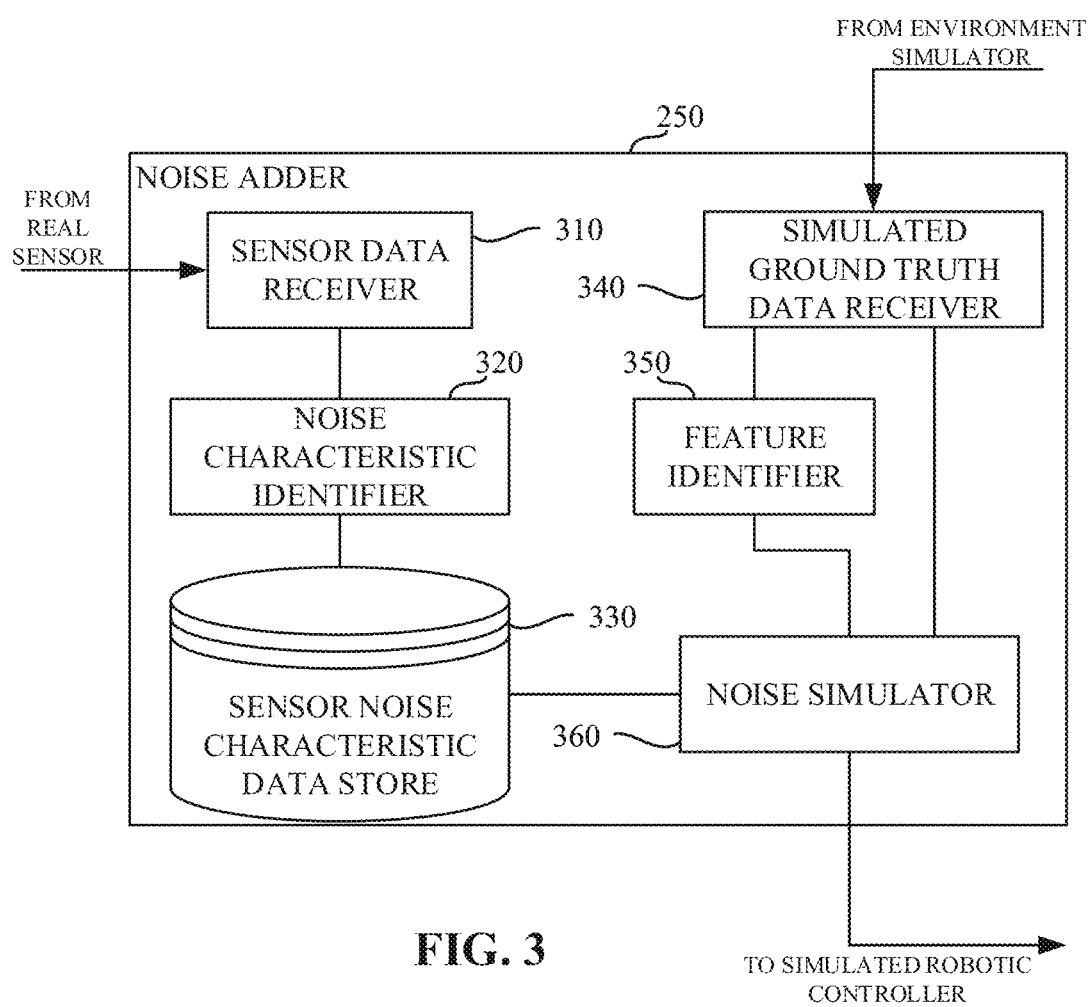
FIG. 3 is a block diagram of the example noise adder of FIG. 2 constructed in accordance with the teachings of this disclosure.

FIG. 3 is a block diagram of the example noise adder of FIG. 2 constructed in accordance with the teachings of this disclosure. The example noise adder 250 of the illustrated example of FIG. 2 and/or three includes an example sensor data receiver 310, an example noise characteristic identifier 320, an example sensor noise characteristic data store 330, an example simulated ground truth data receiver 340, an example feature identifier 350, and an example noise simulator 360.

The example sensor data receiver 310 of the illustrated example of FIG. 3 is implemented by a logic circuit such as, for example, a hardware processor. However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

The example noise characteristic identifier 320 of the illustrated example of FIG. 3 is implemented by a logic circuit such as, for example, a hardware processor. However, any other type of circuitry may additionally or alternatively be used such as, for example, one or more analog or digital circuit(s), logic circuits, programmable processor(s), ASIC(s), PLD(s), FPLD(s), DSP(s), etc. The example noise characteristic identifier 320 implements a neural network such as, for example, a Convolutional Neural Network (CNN). More particularly, the example noise characteristic identifier 320 is implemented using a Visual Geometry Group (VGG) CNN, and extracts the noise characteristics of features present in the real sensor data 255. The example noise characteristic identifier 320 stores the identified noise characteristics and features associated therewith in the example sensor noise characteristic data store 330. In some examples, multiple different types of real-world sensors may be analyzed to identify different noise characteristics of features present in data captured by those sensors. Such an approach enables the example noise simulator 360 to add noise do corresponding different types of sensors simulated by the example environment simulator 240 of FIG. 2.

The example sensor noise characteristic data store 330 of the illustrated example of FIG. 3 is implemented by any memory, storage device and/or storage disc for storing data such as, for example, flash memory, magnetic media, optical media, etc. Furthermore, the data stored in the sensor noise characteristic data store 330 may be in any data format such as, for example, binary data, comma delimited data, tab delimited data, structured query language (SQL) structures, image data, etc. While in the illustrated example, the sensor noise characteristic data store 330 is illustrated as a single element, the sensor noise characteristic data store 330 and/or any other data storage elements described herein may be implemented by any number and/or type(s) of memories. In the illustrated example of FIG. 2, the example sensor noise characteristic data store 330 stores noise characteristics of features present in the real sensor data 255 for later use by the noise simulator 360.

The example simulated ground truth data receiver 340 of the illustrated example of FIG. 3 is implemented by a logic circuit such as, for example, a hardware processor. However, any other type of circuitry may additionally or alternatively be used such as, for example, one or more analog or digital circuit(s), logic circuits, programmable processor(s), ASIC(s), PLD(s), FPLD(s), DSP(s), etc. The example simulated ground truth data receiver 340 accesses the example simulated sensor data 245 from the example environment simulator 240 of FIG. 2. In examples disclosed herein, the simulated sensor data 245 is image data. However, any other data format may additionally or alternatively be used.

The example feature identifier 350 of the illustrated example of FIG. 3 is implemented by a logic circuit such as, for example, a hardware processor. However, any other type of circuitry may additionally or alternatively be used such as, for example, one or more analog or digital circuit(s), logic circuits, programmable processor(s), ASIC(s), PLD(s), FPLD(s), DSP(s), etc. The example feature identifier 350 identifies features of the simulated sensor data 245 received via the example simulated ground truth data receiver 340. In examples disclosed herein, the feature identifier 350 is implemented using a Visual Geometry Group (VGG) CNN, and extracts the features of the simulated sensor data 245. However, any other image-processing techniques may additionally or alternatively be used to perform feature identification using the simulated sensor data 245. The example feature identifier 350 provides the identified features to the example noise simulator 360.

In examples disclosed herein, each layer in the CNN implemented by the example feature identifier 350 represents a non-linear filter bank whose complexity increases with the position of the layer in the neural network. Thus, a given input data $\vec{y}$ is encoded in each layer of the CNN by the filter responses to it. As a result, a layer with $N_l$ distinct filters has $N_l$ feature maps each of size $M_l$, where $M_l$ is the height times the width of the feature map. Thus, the output of a layer/can be represented by a matrix $(F_y)^l \in R^{N_l \times M_l}$, where $(F_y)_{ij}^l$ is the activation of the $i^{th}$ filter at position j in layer l.

The example noise simulator 360 of the illustrated example of FIG. 3 is implemented by a logic circuit such as, for example, a hardware processor. However, any other type of circuitry may additionally or alternatively be used such as, for example, one or more analog or digital circuit(s), logic circuits, programmable processor(s), ASIC(s), PLD(s), FPLD(s), DSP(s), etc. The example noise simulator 360 synthesizes the noise-adjusted simulated sensor data 260 based on the noise characteristics of the identified features and the identified features in the simulated sensor data. In examples disclosed herein, the noise simulator 360 uses random data as a starting point, and iterates an error function to identify parameters that minimize the loss between simulated sensor data 245 and the features identified in the real sensor data 255. In examples disclosed herein, the iteration is performed using a stochastic gradient descent approach. However, any other numerical optimization approach may additionally or alternatively be used such as, for example, a limited memory Broydn-Fletcher-Goldfarb-Shanno (L-BFGS) approach, a BFGS approach, etc. As a result, the example noise simulator 360 provides the noise-adjusted simulated sensor data 260 to the example simulated robotic controller 215.

While an example manner of implementing the example noise adder 250 of FIG. 2 is illustrated in FIG. 3, one or more of the elements, processes and/or devices illustrated in FIG. 3 may be combined, divided, re-arranged, omitted, eliminated and/or implemented in any other way. Further, the example sensor data receiver 310, the example noise characteristic identifier 320, the example simulated ground truth data receiver 340, the example feature identifier 350, the example noise simulator 360, and/or, more generally, the example noise adder 250 of FIG. 2 may be implemented by hardware, software, firmware and/or any combination of hardware, software and/or firmware. Thus, for example, any of the example sensor data receiver 310, the example noise characteristic identifier 320, the example simulated ground truth data receiver 340, the example feature identifier 350, the example noise simulator 360, and/or, more generally, the example noise adder 250 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example sensor data receiver 310, the example noise characteristic identifier 320, the example simulated ground truth data receiver 340, the example feature identifier 350, the example noise simulator 360, and/or, more generally, the example noise adder 250 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example noise adder 250 of FIGS. 2 and/or 3 may include one or more elements, processes and/or devices in addition to, or instead of, those illustrated in FIG. 3, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 4:
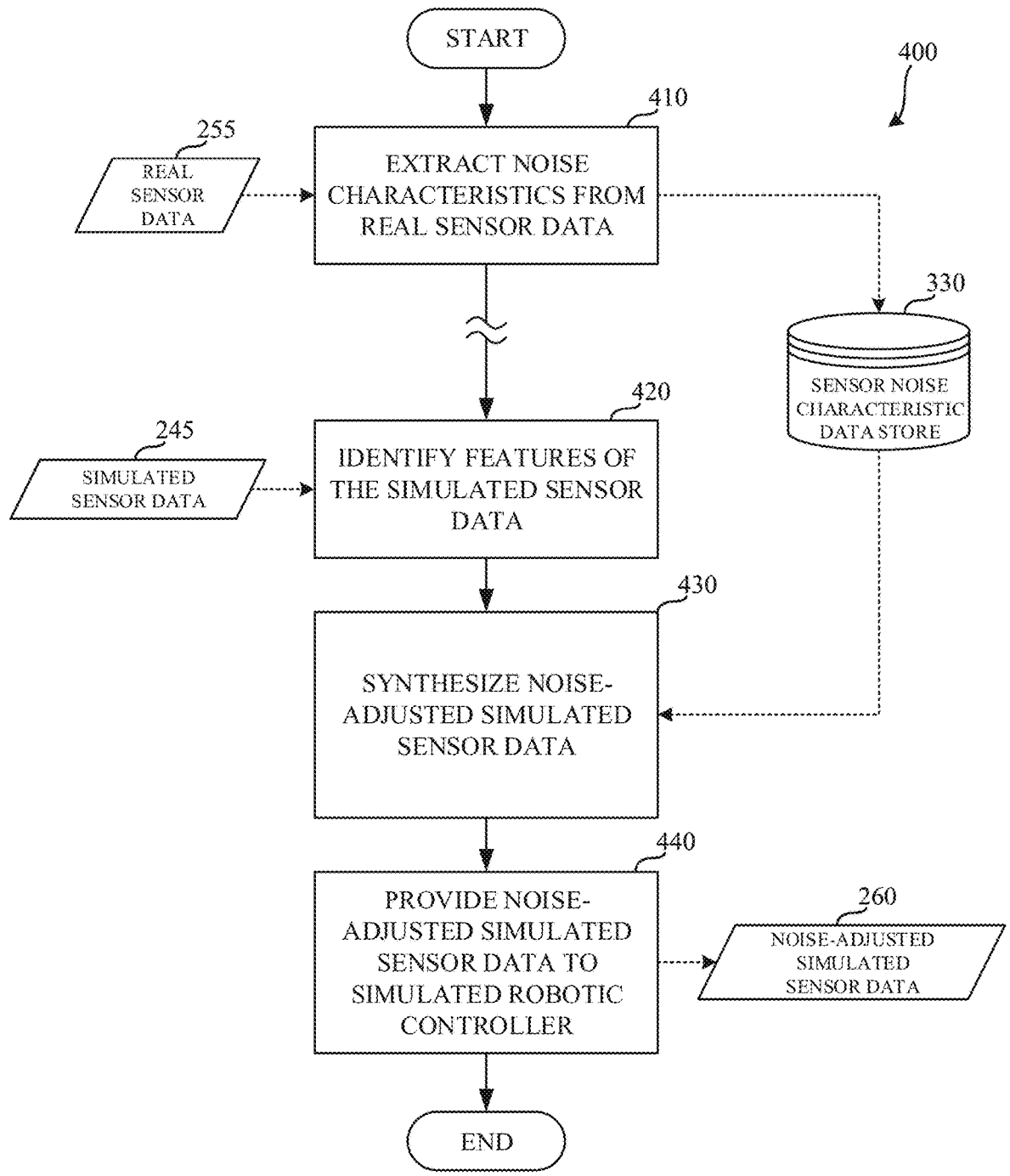
FIG. 4 is a flowchart representative of machine readable instructions which may be executed to implement the example noise adder of FIG. 2 to generate noise-adjusted simulated sensor data.
Figure 5:
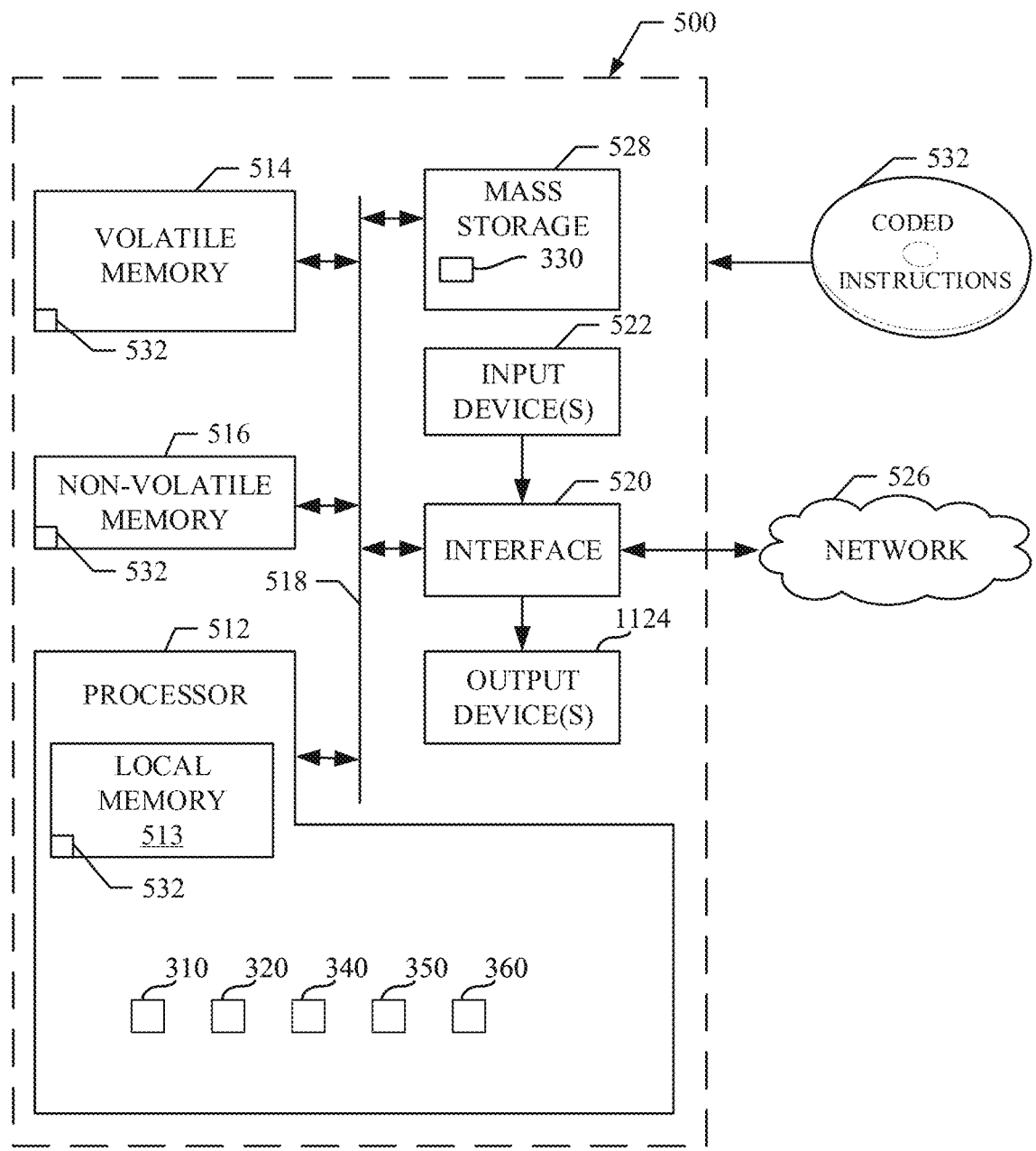
FIG. 5 is a block diagram of an example processing platform structured to execute the instructions of FIG. 4 to implement the example noise adder of FIGS. 2 and/or 3.

A flowchart representative of example hardware logic or machine readable instructions for implementing the example noise adder 250 of FIGS. 2 and/or 3 is shown in FIG. 4. The machine readable instructions may be a program or portion of a program for execution by a processor such as the processor 512 shown in the example processor platform 500 discussed below in connection with FIG. 5. The program may be embodied in software stored on a non-transitory computer readable storage medium such as a CD-ROM, a floppy disk, a hard drive, a DVD, a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowchart illustrated in FIG. 4, many other methods of implementing the example noise adder 250 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example process of FIG. 4 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, and (6) B with C.

The example program 400 of the illustrated example of FIG. 4 begins when the example noise characteristic identifier 320 extracts noise characteristics from the real sensor data 255 accessed via the sensor data receiver 310. (Block 410). In examples disclosed herein, a convolutional neural network (CNN) is used to extract the noise characteristics, and produces different filter responses $(F_n)^l$, corresponding to each of the different features identified in the real sensor data ($\vec{n}$). In examples disclosed herein, the noise characteristics are defined as including correlations between the different filter responses, and can be represented by a Gram matrix $(G_n)^l \in R^{N_l \times N_l}$. Here, $(G_n)^l_{ij}$ is the inner product between the vectorized feature maps i and j in layer l, shown in Equation 1, below.

$$(G_n)^l_{ij} = \sum_k (F_n)^l_{ik} (F_n)^l_{jk} \quad \text{Equation 1}$$

The example noise characteristic identifier 320 stores the identified characteristics in the sensor noise characteristic data store 330 for later use by the noise simulator 360. In some examples, the noise characteristics are extracted from the real sensor data 255 at a time prior to the simulation performed by the example robotic simulation system 210. However, in some examples, the noise characteristics are extracted from the real sensor data 255 upon initialization of a simulation performed by the robotic simulation system 210.

The example feature identifier 350 identifies features of the simulated sensor data 245 received via the example simulated ground truth data receiver 340. (Block 420). In examples disclosed herein, the feature identifier 350 is implemented using a Visual Geometry Group (VGG) CNN, and extracts the features of the simulated sensor data 245. However, any other image-processing techniques may additionally or alternatively be used to perform feature identification using the simulated sensor data 245. In examples disclosed herein, the features are identified as $(F_t)^l$.

The example noise simulator 360 synthesizes the noise-adjusted simulated sensor data 260 based on the noise characteristics of the identified features and the identified features in the simulated sensor data. (Block 430). In examples disclosed herein, the noise simulator 360 uses random data as a starting point, and iterates over Equation 2, below, to minimize loss between the simulated sensor data 245 and noise characteristics associated with features identified in the simulated sensor data 245. Equation 2 is:

$$L_{total} = \alpha L_{noise} + \beta L_{feature} \quad \text{Equation 2}$$

In Equation 2, $L_{noise}$ represents the loss of the noise characteristics between $\vec{x}$ (representing the noise adjusted simulated sensor data 260) and $\vec{n}$ (representing the real sensor data 255). $L_{feature}$ represents a loss of the features between $\vec{x}$ (representing the noise adjusted simulated sensor data 260) and $\vec{t}$ (representing the features identified in the simulated sensor data 245). $\alpha$ and $\beta$ represent weighting factors of the corresponding loss functions. In examples disclosed herein, the example noise simulator 360 performs a stochastic gradient descent, attempting to determine values for $\alpha$ and $\beta$ that result in a minimal total loss value ($L_{total}$). In examples disclosed herein, $\alpha$ and $\beta$ are related using Equation 3:

$$\frac{\alpha}{\beta} = 0.001 \quad \text{Equation 3}$$

However, any other relationship between $\alpha$ and $\beta$ may additionally or alternatively be used. Moreover, while stochastic gradient descent is used to attempt to determine values for $\alpha$ and $\beta$, any other numerical optimization approach may additionally or alternatively be used such as, for example, a limited memory Broydn-Fletcher-Goldfarb-Shanno (L-BFGS) approach, a BFGS approach, etc.

In examples disclosed herein, $L_{noise}$ is represented using Equation 4, below:

$$L_{noise} = \sum_{l=0}^{L} w_l E_l \quad \text{Equation 4}$$

$$E_l = \frac{1}{4N_l^2 M_l^2} \sum_{i,j} ((G_x)^l_{ij} - (G_n)^l_{ij})^2$$

In the illustrated example of Equation 4, $w_l$ represents weight factors of the contribution of each layer of the CNN implemented by the noise characteristic identifier 320. In examples disclosed herein, weighting values for $w_l$ are [0.2,0.2,0.2,0.2,0.2, 0, 0, . . . . . . , 0]. However, any other weighting values may additionally or alternatively be used. In Equation 4, $N_l$ represents a number of feature maps of each layer, and $M_l$ represents a height times a width of the feature map.

In examples disclosed herein, $L_{feature}$, which represents a loss of the features between $\vec{x}$ and $\vec{n}$, is defined as:

$$L_{feature} = \frac{1}{2}\sum_{ij}((F_x)^l_{ij} - (F_t)^l_{ij})^2 \qquad \text{Equation 5}$$

Upon arriving at values for α and β (e.g., solving for equation 2, above) the example noise simulator 360 provides the noise-adjusted simulated sensor data 260 to the simulated robotic controller 215. (Block 440). In examples disclosed herein, the example process 400 of FIG. 4 may then be repeated upon receipt of subsequent simulated sensor data 245. For example, the process of blocks 420 through 440 may be repeated upon receipt of subsequent simulated sensor data 245 to provide subsequent noise-adjusted simulated sensor data 260 to the simulated robotic controller 215.

FIG. 6 is a block diagram of an example processor platform 500 structured to execute the instructions of FIG. 4 to implement the example noise adder 250 of FIGS. 2 and/or 3. The processor platform 500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 500 of the illustrated example includes a processor 512. The processor 512 of the illustrated example is hardware. For example, the processor 512 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example sensor data receiver 310, the example noise characteristic identifier 320, the example simulated ground truth data receiver 340, the example feature identifier 350, and the example noise simulator 360.

The processor 512 of the illustrated example includes a local memory 513 (e.g., a cache). The processor 512 of the illustrated example is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 516 may be implemented by flash memory and/or any other desired type of memory device. Access to the main memory 514, 516 is controlled by a memory controller.

The processor platform 500 of the illustrated example also includes an interface circuit 520. The interface circuit 520 may be implemented by any type of interface standard, such as an Ethernet interface, a universal serial bus (USB), a Bluetooth® interface, a near field communication (NFC) interface, and/or a PCI express interface.

In the illustrated example, one or more input devices 522 are connected to the interface circuit 520. The input device(s) 522 permit(s) a user to enter data and/or commands into the processor 512. The input device(s) can be implemented by, for example, an audio sensor, a microphone, a camera (still or video), a keyboard, a button, a mouse, a touchscreen, a track-pad, a trackball, isopoint, and/or a voice recognition system.

One or more output devices 524 are also connected to the interface circuit 520 of the illustrated example. The output devices 524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 520 of the illustrated example, thus, typically includes a graphics driver card, a graphics driver chip and/or a graphics driver processor.

The interface circuit 520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 500 of the illustrated example also includes one or more mass storage devices 528 for storing software and/or data. Examples of such mass storage devices 528 include floppy disk drives, hard drive disks, compact disk drives, Blu-ray disk drives, redundant array of independent disks (RAID) systems, and digital versatile disk (DVD) drives.

The machine executable instructions 532 of FIG. 4 may be stored in the mass storage device 528, in the volatile memory 514, in the non-volatile memory 516, and/or on a removable non-transitory computer readable storage medium such as a CD or DVD. In the illustrated example of FIG. 5, the example mass storage implements the example sensor noise characteristic data store 330.

From the foregoing, it will be appreciated that example methods, apparatus and articles of manufacture have been disclosed that utilize one or more neural networks to perform synthesis of simulated vision sensor data. Such approaches enable robotic simulation systems to generate noise-adjusted simulated sensor data that more closely resembles real sensor data. Utilizing noise-adjusted simulated sensor data enables simulated robotic controllers (e.g., virtual controllers) to train robotic control systems more efficiently, as such training does not rely on real-world interactions (e.g., a robot being moved in a physical space).

Example methods, apparatus, systems, and articles of manufacture to simulate sensor data are disclosed herein. Further examples and combinations thereof include the following:

Example 1 includes an apparatus for simulating sensor data, the apparatus comprising a noise characteristic identifier to extract a noise characteristic associated with a feature present in first sensor data obtained by a physical sensor, a feature identifier to identify a feature present in second sensor data, the second sensor data generated by an environment simulator simulating a virtual representation of the physical sensor, and a noise simulator to synthesize noise-adjusted simulated sensor data based on the feature identified in the second sensor data and the noise characteristic associated with the feature present in the first sensor data.

Example 2 includes the apparatus of example 1, further including a simulated ground truth data receiver to access the second sensor data generated by the environment simulator.

Example 3 includes the apparatus of example 1, further including a sensor noise characteristic data store to store the extracted noise characteristic, the noise simulator to synthesize the noise-adjusted simulated sensor data based on the noise characteristic stored in the sensor noise characteristic data store.

Example 4 includes the apparatus of example 1, wherein the second sensor data represents a virtualized version of a same type of sensor represented by the first sensor data.

Example 5 includes the apparatus of example 1, wherein the feature identifier is implemented using a convolutional neural network.

Example 6 includes the apparatus of example 5, wherein the convolutional neural network is a visual geometry group convolutional neural network.

Example 7 includes the apparatus of any one of examples 1-6, wherein the noise simulator is to synthesize the noise-adjusted simulated sensor data based on a sum of a first loss function representing noise characteristics between the noise-adjusted simulated sensor data and the first sensor data, and a second loss function representing features between noise-adjusted simulated sensor data and the identified features.

Example 8 includes the apparatus of example 7, wherein the noise simulator is to perform a stochastic gradient descent to select a weighting value applied to the first loss function that minimizes the sum.

Example 9 includes at least one non-transitory machine-readable storage medium comprising instructions which, when executed, cause a processor to at least extract a noise characteristic associated with a feature present in first sensor data, the first sensor data captured by a physical sensor, identify a feature present in second sensor data, the second sensor data generated by an environment simulator simulating a virtual representation of the physical sensor, and synthesize noise-adjusted simulated sensor data based on the feature identified in the second sensor data and the noise characteristic associated with the feature present in the first sensor data.

Example 10 includes the at least one non-transitory machine-readable medium of example 9, wherein the instructions, when executed, further cause the processor to store the extracted noise characteristic in a sensor noise characteristic data store, wherein the synthesizing of the noise-adjusted simulated sensor data is further based on the noise characteristic stored in the sensor noise characteristic data store.

Example 11 includes the at least one non-transitory machine-readable medium of example 9, wherein the instructions, when executed, further cause the processor to identify the feature present in the second sensor data using a convolutional neural network.

Example 12 includes the at least one non-transitory machine-readable medium of example 11, wherein the convolutional neural network is a visual geometry group convolutional neural network.

Example 13 includes the at least one non-transitory machine-readable medium of any one of examples 9-12, wherein the instructions, when executed, cause the processor to synthesize the noise-adjusted simulated sensor data based on a sum of a first loss function representing noise characteristics between the noise-adjusted simulated sensor data and the first sensor data, and a second loss function representing features between noise-adjusted simulated sensor data and the identified features.

Example 14 includes the at least one non-transitory machine-readable medium of example 13, wherein the instructions, when executed, cause the processor to perform a stochastic gradient descent to select a weighting value applied to the first loss function that minimizes the sum.

Example 15 includes a method for simulating sensor data, the method comprising extracting, by executing an instruction with a processor, a noise characteristic associated with a feature present in first sensor data, the first sensor data captured by a physical sensor, identifying, by executing an instruction with the processor, a feature present in second sensor data, the second sensor data generated by an environment simulator simulating a virtual representation of the physical sensor, and synthesizing, by executing an instruction with the processor, noise-adjusted simulated sensor data based on the feature identified in the second sensor data and the noise characteristic associated with the feature present in the first sensor data.

Example 16 includes the method of example 15, further including storing the extracted noise characteristic in a sensor noise characteristic data store, and wherein the synthesizing of the noise-adjusted simulated sensor data is further based on the noise characteristic stored in the sensor noise characteristic data store.

Example 17 includes the method of example 15, wherein the identifying of the feature present in the simulated sensor data is performed using a convolutional neural network.

Example 18 includes the method of any one of examples 15-17, wherein the convolutional neural network is a visual geometry group convolutional neural network.

Example 19 includes the method of any one of examples 15-18, wherein the synthesizing of the noise-adjusted simulated sensor data is based on a sum of a first loss function representing noise characteristics between the noise-adjusted simulated sensor data and the first sensor data, and a second loss function representing features between noise-adjusted simulated sensor data and the identified features.

Example 20 includes the method of example 19, wherein the synthesizing further includes performing a stochastic gradient descent to select a weighting value applied to the first loss function that minimizes the sum.

Example 21 includes an apparatus for simulating sensor data, the apparatus comprising means for extracting a noise characteristic associated with a feature present in first sensor data, the first sensor data captured by a physical sensor, means for identifying a feature present in second sensor data, the second sensor data generated by an environment simulator simulating a virtual representation of the physical sensor, and means for synthesizing noise-adjusted simulated sensor data based on the feature identified in the second sensor data and the noise characteristic associated with the feature present in the first sensor data.

Example 22 includes the apparatus of example 21, wherein the means for extracting is further to store the extracted noise characteristic in a sensor noise characteristic data store, and wherein the means for synthesizing is further to synthesize the noise-adjusted simulated sensor data based on the noise characteristic stored in the sensor noise characteristic data store.

Example 23 includes the apparatus of example 21, means for identifying is implemented using a convolutional neural network.

Example 24 includes the apparatus of example 21, wherein the means for synthesizing is further to synthesize the noise-adjusted simulated sensor data based on a sum of a first loss function representing noise characteristics between the noise-adjusted simulated sensor data and the first sensor data, and a second loss function representing features between noise-adjusted simulated sensor data and the identified features.

Example 25 includes the apparatus of example 24, wherein the means for synthesizing is further to perform a stochastic gradient descent to select a weighting value applied to the first loss function that minimizes the sum.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus for simulating sensor data, the apparatus comprising:
   at least one memory;
   machine readable instructions; and
   a processor to execute the machine readable instructions to:
   extract a noise characteristic associated with a feature present in first sensor data obtained by a physical sensor;
   identify a feature present in second sensor data, the second sensor data generated by an environment simulator simulating a virtual representation of the physical sensor; and
   synthesize noise-adjusted simulated sensor data based on a combination of:
   a first loss function based on noise characteristics of the noise-adjusted simulated sensor data and the feature present in the first sensor data; and
   a second loss function based on the noise-adjusted simulated sensor data and the feature identified in the second sensor data.

2. The apparatus of claim 1, wherein the processor is to access the second sensor data generated by the environment simulator.

3. The apparatus of claim 1, wherein the processor is to store the extracted noise characteristic to and synthesize the noise-adjusted simulated sensor data based on the noise characteristic stored.

4. The apparatus of claim 1, wherein the second sensor data represents a virtualized version of a same type of sensor represented by the first sensor data.

5. The apparatus of claim 1, wherein the processor is to identify of a feature present in second sensor data using a convolutional neural network.

6. The apparatus of claim 5, wherein the convolutional neural network is a Visual Geometry Group convolutional neural network.

7. The apparatus of claim 1, wherein the processor is to perform a stochastic gradient descent to select a weighting value applied to the first loss function.

8. At least one non-transitory machine-readable storage medium comprising instructions which, when executed, cause a processor to at least:
   extract a noise characteristic associated with a feature present in first sensor data, the first sensor data captured by a physical sensor;
   identify a feature present in second sensor data, the second sensor data generated by an environment simulator simulating a virtual representation of the physical sensor; and
   synthesize noise-adjusted simulated sensor data based on a combination of:
   a first loss function based on noise characteristics of the noise-adjusted simulated sensor data and the feature present in first sensor data; and
   a second loss function based on the noise-adjusted simulated sensor data and the feature identified in the second sensor data.

9. The at least one non-transitory machine-readable medium of claim 8, wherein the instructions, when executed, further cause the processor to store the extracted noise characteristic in a sensor noise characteristic data store, wherein the synthesizing of the noise-adjusted simulated sensor data is further based on the noise characteristic stored in the sensor noise characteristic data store.

10. The at least one non-transitory machine-readable medium of claim 8, wherein the instructions, when executed, further cause the processor to identify the feature present in the second sensor data using a convolutional neural network.

11. The at least one non-transitory machine-readable medium of claim 10, wherein the convolutional neural network is a Visual Geometry Group convolutional neural network.

12. The at least one non-transitory machine-readable medium of claim 8, wherein the instructions, when executed, cause the processor to perform a stochastic gradient descent to select a weighting value applied to the first loss function.

13. A method for simulating sensor data, the method comprising:
   extracting, by executing an instruction with a processor, a noise characteristic associated with a feature present in first sensor data, the first sensor data captured by a physical sensor;
   identifying, by executing an instruction with the processor, a feature present in second sensor data, the second sensor data generated by an environment simulator simulating a virtual representation of the physical sensor; and
   synthesizing, by executing an instruction with the processor, noise-adjusted simulated sensor data based on a combination of:
   a first loss function representing noise characteristics of the noise-adjusted simulated sensor data and the feature present in the first sensor data; and
   a second loss function based on the noise-adjusted simulated sensor data and the features identifies in the second sensor data.

14. The method of claim 13, further including storing the extracted noise characteristic in a sensor noise characteristic data store, and wherein the synthesizing of the noise-adjusted simulated sensor data is further based on the noise characteristic stored in the sensor noise characteristic data store.

15. The method of claim 13, wherein the identifying of the feature present in the simulated sensor data is performed using a convolutional neural network.

16. The method of claim 13, wherein the convolutional neural network is a Visual Geometry Group convolutional neural network.

17. The method of claim 13, wherein the synthesizing further includes performing a stochastic gradient descent to select a weighting value applied to the first loss function.

18. An apparatus for simulating sensor data, the apparatus comprising:
   means for extracting a noise characteristic associated with a feature present in first sensor data, the first sensor data captured by a physical sensor;

means for identifying a feature present in second sensor data, the second sensor data generated by an environment simulator simulating a virtual representation of the physical sensor; and means for synthesizing noise-adjusted simulated sensor data based on a combination of:
- a first loss function based on noise characteristics associated with of the noise-adjusted simulated sensor data and the feature present in the first sensor data; and
- a second loss function based on the noise-adjusted simulated sensor data and the feature identified in the second sensor data.

19. The apparatus of claim 18, wherein the means for extracting is to store the extracted noise characteristic in a sensor noise characteristic data store, and wherein the means for synthesizing is further to synthesize the noise-adjusted simulated sensor data based on the noise characteristic stored in the sensor noise characteristic data store.

20. The apparatus of claim 18, means for identifying is implemented using a convolutional neural network.

21. The apparatus of claim 18, wherein the means for synthesizing is to perform a stochastic gradient descent to select a weighting value applied to the first loss function.

\* \* \* \* \*